(12) United States Patent
Mori et al.

(10) Patent No.: US 8,212,370 B2
(45) Date of Patent: Jul. 3, 2012

(54) RESIN PASTE FOR DIE BONDING, CONTAINING A POLYURETHANEIMIDE RESIN AND THERMOSETTING RESIN METHOD FOR MANUFACTURING SEMICONDUCTOR DEVICE, AND SEMICONDUCTOR DEVICE, USING THE RESIN PASTE

(75) Inventors: Syuichi Mori, Hitachi (JP); Yuji Hasegawa, Hitachi (JP); Minoru Sugiura, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 188 days.

(21) Appl. No.: 12/444,230

(22) PCT Filed: Sep. 28, 2007

(86) PCT No.: PCT/JP2007/069038
§ 371 (c)(1),
(2), (4) Date: Mar. 12, 2010

(87) PCT Pub. No.: WO2008/041646
PCT Pub. Date: Apr. 10, 2008

(65) Prior Publication Data
US 2010/0155969 A1   Jun. 24, 2010

(30) Foreign Application Priority Data

Oct. 4, 2006 (JP) ................ P2006-273006
May 23, 2007 (JP) ................ P2007-137005

(51) Int. Cl.
*H01L 23/00* (2006.01)
*H01L 21/50* (2006.01)
*C09J 175/04* (2006.01)

(52) U.S. Cl. ......... 257/798; 257/E23.002; 257/E21.499; 524/590; 438/118

(58) Field of Classification Search .................. 257/798, 257/E23.002, E21.499; 524/590; 438/118
See application file for complete search history.

(56) References Cited

U.S. PATENT DOCUMENTS

2010/0143673 A1* 6/2010 Mitsukura et al. ............ 428/201
(Continued)

FOREIGN PATENT DOCUMENTS

EP   2 053 108 A1 *   4/2009
(Continued)

OTHER PUBLICATIONS

Korean Official Action dated Nov. 22, 2010, for KR Application No. 10-2009-7005027.
(Continued)

*Primary Examiner* — A O Williams
(74) *Attorney, Agent, or Firm* — Antonelli, Terry, Stout & Kraus, LLP.

(57) ABSTRACT

The die bonding resin paste of the invention comprises a polyurethaneimide resin represented by the following general formula (I), a thermosetting resin, a filler and a printing solvent.

[Chemical Formula 1]

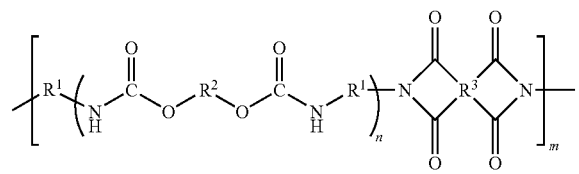

[wherein R1 represents a divalent organic group containing an aromatic ring or aliphatic ring, R2 represents a divalent organic group with a molecular weight of 100-10,000, R3 represents a tetravalent organic group containing 4 or more carbon atoms, and n and m each independently represent an integer of 1-100.]

9 Claims, 1 Drawing Sheet

U.S. PATENT DOCUMENTS

2010/0178501 A1\* 7/2010 Masuko et al. ........... 428/355 N
2010/0239858 A1\* 9/2010 Masuko et al. ............... 428/354

FOREIGN PATENT DOCUMENTS

| JP | 1-253244 | 10/1989 |
|----|----------|---------|
| JP | 6-145639 | 5/1994 |
| JP | 6-264035 | 9/1994 |
| JP | 7-228697 | 8/1995 |
| JP | 2005-105251 | 4/2005 |
| JP | 2005-220340 | 8/2005 |
| JP | 2006-032936 | 2/2006 |
| KR | 10-2005-0073528 | 7/2005 |
| WO | WO 2005/105943 | 11/2005 |

OTHER PUBLICATIONS

Translation of the International Preliminary Report on Patentability dated Apr. 30, 2009, for Application No. PCTP/JP2007/069038.

Korean Official Action dated Jul. 29, 2011, for KR Application No. 10-2009-7005027.

Japanese Official Action dated May 8, 2012, for JP Application No. 2008-537517.

\* cited by examiner

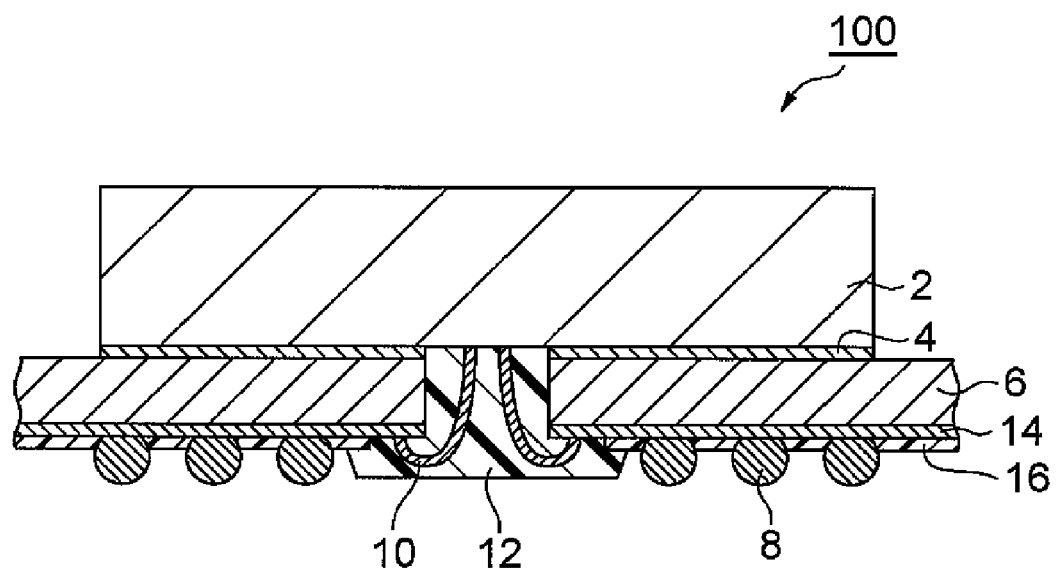

RESIN PASTE FOR DIE BONDING, CONTAINING A POLYURETHANEIMIDE RESIN AND THERMOSETTING RESIN METHOD FOR MANUFACTURING SEMICONDUCTOR DEVICE, AND SEMICONDUCTOR DEVICE, USING THE RESIN PASTE

TECHNICAL FIELD

The present invention relates to a die bonding resin paste, to a process for production of a semiconductor device and to a semiconductor device, and more specifically it relates to a die bonding resin paste that can be used as a bonding material (die bonding material) for semiconductor elements such as ICs and LSIs, and supporting members such as lead frames and insulating support bases, and to a process for production of a semiconductor device and a semiconductor device employing the same.

BACKGROUND ART

Au—Si eutectic alloys, solder and silver paste are known in the prior art as bonding materials for bonding of ICs or LSIs with lead frames. Adhesive films employing specific polyimide resins, and die bonding adhesive films comprising conductive fillers or inorganic fillers added to polyimide resins have already been proposed (see Patent documents 1-3).
[Patent document 1] Japanese Unexamined Patent Publication HEI No. 07-228697
[Patent document 2] Japanese Unexamined Patent Publication HEI No. 06-145639
[Patent document 3] Japanese Unexamined Patent Publication HEI No. 06-264035

DISCLOSURE OF THE INVENTION

Problems to be Solved by the Invention

Au—Si eutectic alloys have high heat resistance and humidity resistance, but their large elastic modulus results in problems such as cracking when they are used for large chips. Another disadvantage of Au—Si eutectic alloys is their high cost. Solder, on the other hand, is inexpensive yet with poor heat resistance, while its elastic modulus is also high like Au—Si eutectic alloys, rendering it poorly suitable for large chips.

Silver pastes, on the other hand, are inexpensive, exhibit high humidity resistance and have lower elastic moduli than Au—Si eutectic alloys or solder, while also exhibiting heat resistance that allows them to be used in 350° C. thermocompression bonding wire bonders. Currently, therefore, silver pastes are the main types of die bonding materials used. However, with increasingly higher integration of ICs and LSIs and larger chip sizes, it is becoming more difficult to evenly coat silver pastes over the entire surfaces of chips when silver pastes are used for bonding of ICs or LSIs with lead frames.

Moreover, insulating support bases are being used more widely as packages continue to be downsized and reduced in weight as in recent years, and increasing focus is being directed toward methods aimed at more productive printing of die bonding materials in order to lower manufacturing costs. Under these circumstances, when it is attempted to efficiently supply and attach an adhesive film such as described in Patent documents 1-3 mentioned above onto an insulating support base, it has been necessary to pre-cut (or punch) it to the chip size and then attach it to the adhesive film.

An applicator is necessary for increased production efficiency in methods where adhesive films are cut to chip sizes before attachment to boards. In methods where adhesive films are punched and attached in batches onto multiple chip parts, portions of the adhesive film tend to be wasted. In addition, since the majority of an insulating support base has inner wiring formed inside the board, numerous irregularities are present on the surface to which the adhesive film is attached, resulting in creation of gaps during attachment of the adhesive film and thus lowering the reliability.

Moreover, in methods where a die bonding material is first formed on a board and a semiconductor chip is attached to it, the die bonding material coated onto the board is subjected to dry semi-curing (B-staging) before attachment of the semiconductor chip, and then the semiconductor chip is contact bonded thereto and the die bonding material is cured for 1 hour in an oven at 180° C., for example, as postcuring. Recently, however, from the viewpoint of process control and shorter assembly time, there has been a demand for die bonding materials that allow the postcuring step to be eliminated while still conducting the subsequent assembly steps such as wire bonding and sealing. In most cases the wire bonding temperature is 120° C.-150° C. and the sealing temperature is 170° C.-190° C., and the curing step for the sealing material involves heating at, for example, 180° C. for 2-5 hours. When the postcuring step is omitted, the die bonding material after contact bonding of the chip is simultaneously postcured in the sealing material curing step after the steps of wire bonding and sealing. Therefore, a die bonding material that is in the B-stage state in an assembly process lacking a postcuring step must exhibit heat resistance and chip adhesion at around 180° C.

It is an object of the present invention, which has been accomplished in light of the current circumstances, to provide a die bonding resin paste that allows subsequent steps to be carried out when the resin paste curing step following attachment of the semiconductor chip is omitted, or in other words, that can exhibit sufficient heat resistance and chip adhesion in the B-stage condition. It is another object of the invention to provide a process for production of a semiconductor device, and a semiconductor device, that employ the die bonding resin paste.

Means for Solving the Problems

In order to achieve the object stated above, the invention provides a die bonding resin paste comprising a polyurethaneimide resin represented by the following general formula (I), a thermosetting resin, a filler and a printing solvent.

[Chemical Formula 1]

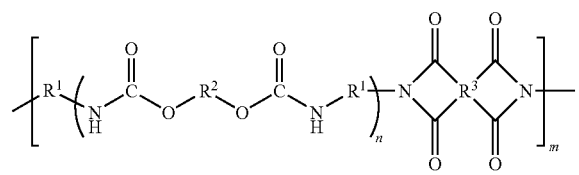

[wherein $R^1$ represents a divalent organic group containing an aromatic ring or aliphatic ring, $R^2$ represents a divalent organic group with a molecular weight of 100-10,000, $R^3$ represents a tetravalent organic group containing 4 or more carbon atoms, and n and m each independently represent an integer of 1-100.]

The die bonding resin paste contains the polyurethaneimide resin represented by general formula (I) above, together with a thermosetting resin, filler and printing solvent, so that satisfactory heat resistance and chip adhesion can be obtained in the B-stage state, and subsequent assembly steps can be carried out even if the postcuring step following attachment of the semiconductor chip is omitted. Furthermore, a die bonding resin paste having the construction described above can be easily supplied and coated by printing onto boards that require attachment of semiconductor chips at relatively low temperature.

The invention further provides a process for production of a semiconductor device that comprises a coating step in which the die bonding resin paste of the invention is coated onto a board to form a coated film, and a semiconductor chip mounting step in which a semiconductor chip is mounted onto the coated film.

Since this semiconductor device production process employs a die bonding resin paste according to the invention, it is possible to attach semiconductor chips onto boards at relatively low temperature, to obtain a semiconductor device with excellent heat resistance and chip adhesion.

The process for production of a semiconductor device according to the invention preferably further comprises a drying step after the coating step, in which the coated film is dried for B-staging, and preferably the semiconductor chip is mounted on the B-staged coated film in the semiconductor chip mounting step.

The die bonding resin paste of the invention can exhibit satisfactory heat resistance and chip adhesion in the B-stage state, so that a semiconductor device with more excellent reliability can be obtained by including the drying step described above.

The invention still further provides a semiconductor device obtained by the process for production of a semiconductor device according to the invention. The semiconductor device has a semiconductor chip attached to a board using a die bonding resin paste according to the invention, thus allowing excellent heat resistance and chip adhesion to be obtained.

Effect of the Invention

According to the invention it is possible to provide a die bonding resin paste that can be easily supplied and coated by printing onto boards that require attachment of semiconductor chips at relatively low temperature. Moreover, the die bonding resin paste of the invention is heat resistant and manageable, while exhibiting low stress properties and low-temperature adhesion. Furthermore, since its heat resistance is excellent in the B-stage state, it is possible to omit the postcuring step following contact bonding of the semiconductor chip, thus aiding in process control and shortening of the assembly time for assembly of semiconductor devices. The die bonding resin paste of the invention may be suitably used for die bonding of insulating support bases such as organic boards, and copper lead frames, as well as for 42-alloy lead frames. According to the invention it is also possible to provide a process for production of a semiconductor device employing the die bonding resin paste of the invention, and a semiconductor device produced by the production process.

BRIEF DESCRIPTION OF THE DRAWINGS

FIG. 1 is a schematic cross-sectional view showing an embodiment of a semiconductor device according to the invention.

EXPLANATION OF SYMBOLS

2: Semiconductor chip, 4: adhesive, 6: board, 8: solder ball, 10: wire, 12: sealing resin, 100: semiconductor device.

BEST MODE FOR CARRYING OUT THE INVENTION

Preferred embodiments of the invention will now be described in detail.

A die bonding resin paste according to the invention (hereinafter also referred to as "resin paste") comprises (A) a polyurethaneimide resin represented by the following general formula (I) (hereinafter also referred to as "component (A)").

[Chemical Formula 2]

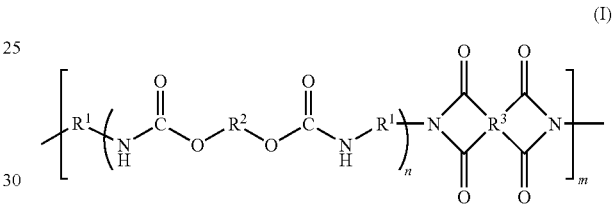

[wherein $R^1$ represents a divalent organic group containing an aromatic ring or aliphatic ring, $R^2$ represents a divalent organic group with a molecular weight of 100-10,000, $R^3$ represents a tetravalent organic group containing 4 or more carbon atoms, and n and m each independently represent an integer of 1-100.]

The resin paste of the invention preferably further comprises, in addition to component (A) mentioned above, (B) a butadiene polymer (homopolymer or copolymer) with a carboxylic acid end group (hereinafter also referred to as "component (B)").

The resin paste of the invention also comprises, in addition to component (A) mentioned above, (C) a thermosetting resin (hereinafter also referred to as "component (C)"), (D) a filler (hereinafter also referred to as "component (D)") and (E) a printing solvent (hereinafter also referred to as "component (E)"). Each of the components will now be explained in detail.

The (A) polyurethaneimide resin is represented by general formula (I) above. The divalent organic group containing an aromatic ring or aliphatic ring represented by $R^1$ in general formula (I) is preferably a diisocyanate residue, and more preferably it contains the structure represented by the following general formula (II):

[Chemical Formula 3]

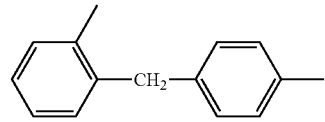

at 10-100 mol %.

The rest of the diisocyanate residue may be represented by the following formula:

[Chemical Formula 4]

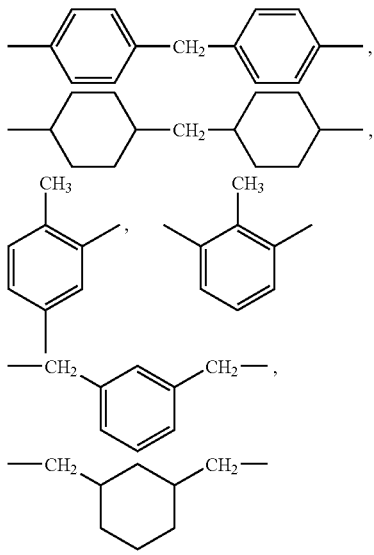

and any one or combination of two or more of these may be used.

The divalent organic group with a molecular weight of 100-10,000 represented by $R^2$ in general formula (I) is preferably a diol residue, and more preferably it contains a structure with a repeating unit represented by the following general formula (III):

[Chemical Formula 5]

—(CH$_2$—CH$_2$—CH$_2$—CH$_2$—O)—  (III)

at 10-100 mol %.

The rest of the diol residue may be one with a repeating unit represented by the following formula:

—(CH$_2$CH(CH$_8$)—O)—,

—(CH$_2$—CH$_2$—O)—,

—(CH$_2$—CH$_2$—CH$_2$—CH$_2$—O)—,

—(CH$_2$—CH(CH$_3$)—O)a-(CH$_2$—CH$_2$—O)b-(Co-polymer:a/b=9-1/1-9 mol %)

—[CO—(CH$_2$)$_4$—CO—O—(CH$_2$)$_2$—O]—,

—[CO—(CH$_2$)$_4$—CO—O—(CH$_2$)$_2$—O—(CH$_2$)$_2$—O]—,

—[CO—(CH$_2$)$_4$—CO—O—CH$_2$—CH(CH$_3$)—O]—,

—[CO—(CH$_2$)$_4$—CO—O—(CH$_2$)$_4$—O]—,

—[CO—(CH$_2$)$_4$—CO—O—(CH$_2$)$_6$—O]—,

—[CO—(CH$_2$)$_4$—CO—O—CH$_2$—C(CH$_3$)$_2$—CH$_2$—O]—,

—[CO—(CH$_2$)$_8$—CO—O—(CH$_2$)$_6$—O]—,

—[CO—(CH$_2$)$_5$—O]—,

—[CO—O—(CH$_2$)$_6$—O]—,

—R$^4$—(Si(CH$_3$)$_2$—O)—R$^4$—(R$^4$=C1-10 organic group)    [Chemical Formula 6]

and any one or combination of two or more of these may be used. The weight-average molecular weight is preferably 100-10,000 and more preferably 500-5,000.

The tetravalent organic group containing 4 or more carbon atoms represented by $R^3$ in general formula (I) is preferably a tetracarboxylic anhydride residue, and it may be one with the following formula.

[Chemical Formula 7]

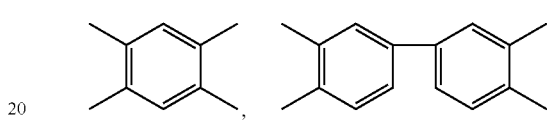

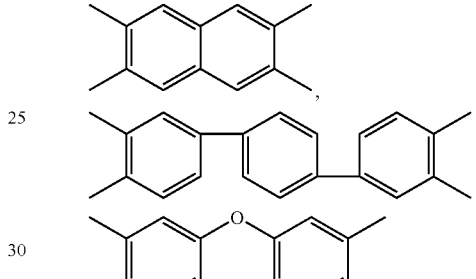

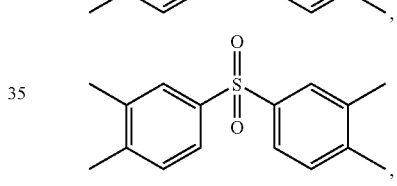

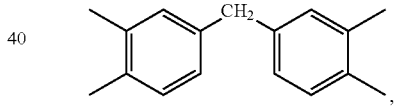

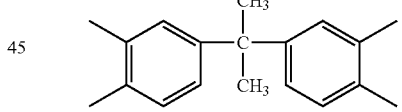

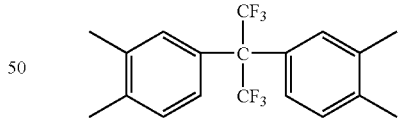

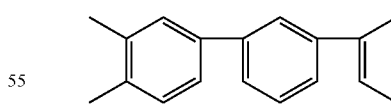

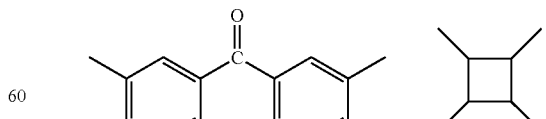

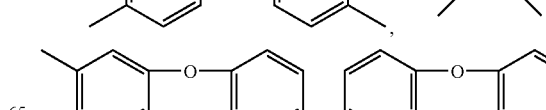

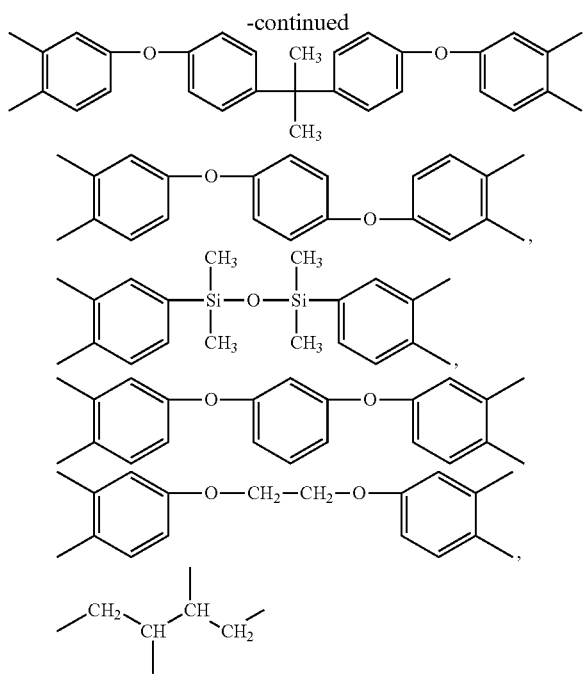

Any one or combination of two or more such compounds may be used.

The letters n and m in general formula (I) must each independently be an integer of 1-100, and preferably each is an integer of 1-50.

The (A) polyurethaneimide resin may be synthesized by an ordinary method such as solution polymerization. In the case of solution polymerization, for example, the diisocyanate and diol are dissolved in a solvent in which the polyurethaneimide resin to be produced will dissolve, such as N-methyl-2-pyrrolidone (NMP), and reacted at 70° C.-180° C. for 1-5 hours to synthesize a urethane oligomer. Next, tetracarboxylic dianhydride may be added prior to reaction at 70° C.-180° C. for 1-10 hours to obtain an NMP solution of the polyurethaneimide resin. A monovalent alcohol, oxime, amine, isocyanate, acid anhydride or the like may then be optionally added and reaction continued for end modification of the polyurethaneimide resin. Water, an alcohol or a tertiary amine may also be used as a catalyst during the synthesis.

The obtained polyurethaneimide resin solution may be subjected to reprecipitation with water, depending on the purpose, for separation of the polyurethaneimide resin. The compositional ratio of the diisocyanate and diol in the urethane oligomer is preferably 0.1-1.0 mol of diol component to 1.0 mol of diisocyanate. The compositional ratio of the polyurethane oligomer and tetracarboxylic dianhydride in the polyurethaneimide resin is preferably 0.1-2.0 mol of tetracarboxylic dianhydride to 1.0 mol of polyurethane oligomer.

The (A) polyurethaneimide resin according to the invention preferably has a weight-average molecular weight of 5,000-500,000 and more preferably 10,000-100,000 in terms of polystyrene, as measured by gel permeation chromatography using tetrahydrofuran as the solvent. A weight-average molecular weight of less than 5,000 will tend to lower the strength of the resin, while greater than 500,000 will tend to result in inferior solubility of the resin.

The content of component (A) in the resin paste is preferably 20-60 mass % based on the total solid mass of the resin paste. A content of greater than 60 mass % will tend to lower the curability, while a content of less than 20 mass % will tend to lower the chip adhesion in the B-stage state.

As preferred examples of butadiene homopolymers or copolymers having carboxylic acid end groups as component (B), there may be mentioned low molecular weight liquid polybutadienes with acrylonitrile introduced into the main chain and having carboxylic acid at the ends, such as "Hycer CTB-2009×162", "CTBN-1300×31", "CTBN-1300×8", "CTBN-1300×13" and "CTBNX-1300×9" (all products of Ube Industries, Ltd.), and low molecular weight liquid polybutadienes with carboxylic acid groups, such as "NISSO-PB-C-2000" (product of Nippon Soda Co., Ltd.). These may be used alone or in combinations of two or more.

The content of component (B) in the resin paste is preferably no greater than 200 parts by mass and more preferably no greater than 100 parts by mass with respect to 100 parts by mass of component (A). If the content exceeds 200 parts by mass, chip adhesion in the B-stage state will tend to be reduced.

Epoxy resins may be mentioned as preferred examples of thermosetting resins for component (C). Component (C) may be a resin mixture comprising an epoxy resin, a phenol resin or a compound with a phenolic hydroxyl group in the molecule, and a curing accelerator. By including the (C) thermosetting resin, the resin paste will exhibit high reliability after simultaneous curing with sealing materials.

An epoxy resin contains at least two epoxy groups in the molecule, and it is preferably a phenol glycidyl ether-type epoxy resin from the viewpoint of curability and cured product properties. As such resins there may be mentioned condensation products of bisphenol A, bisphenol AD, bisphenol S, bisphenol F or halogenated bisphenol A with epichlorohydrin, phenol-novolac resin glycidyl ether, cresol-novolac resin glycidyl ether and bisphenol A-novolac resin glycidyl ether. These may be used alone or in combinations of two or more.

When an epoxy resin is used as component (C), the content is preferably no greater than 300 parts by mass, more preferably no greater than 200 parts by mass and even more preferably 5-100 parts by mass with respect to 100 parts by mass of component (A). If the content is greater than 300 parts by mass, the storage stability of the resin paste will tend to be lowered.

A phenol resin has at least two phenolic hydroxyl groups in the molecule, and as examples there may be mentioned phenol-novolac resin, cresol-novolac resin, bisphenol A-novolac resin, poly-p-vinylphenol and phenolaralkyl resin. These may be used alone or in combinations of two or more.

The content of a phenol resin or a compound with a phenolic hydroxyl group in the molecule in component (C) is preferably no greater than 150 parts by mass, more preferably no greater than 120 parts by mass and even more preferably 10-120 parts by mass with respect to 100 parts by mass of the epoxy resin. If the content exceeds 150 parts by mass the curability may be insufficient. The curability may also be insufficient if the content is less than 10 parts by mass.

The curing accelerator is not particularly restricted so long as it can be used for curing of the epoxy resin. As examples of such curing accelerators there may be mentioned imidazoles, dicyandiamide derivatives, dicarboxylic dihydrazide, triphenylphosphine, tetraphenylphosphoniumtetraphenyl borate, 2-ethyl-4-methylimidazoletetraphenyl borate, 1,8-diazabicyclo(5,4,0)undecene-7-tetraphenyl borate and the like. Any of these may be used alone or in combinations of two or more.

The content of the curing accelerator in component (C) is preferably no greater than 50 parts by mass, more preferably no greater than 20 parts by mass and even more preferably 0.1-20 parts by mass with respect to 100 parts by mass of the epoxy resin. If the content is greater than 50 parts by mass, the storage stability of the resin paste may be lowered. A content of less than 0.1 part by mass may result in an insufficient accelerating effect on curing and inadequate curability.

The (C) thermosetting resin may be an imide compound with at least two thermosetting imide groups in each molecule. As examples of such compounds there may be mentioned orthobismaleimidebenzene, metabismaleimidebenzene, parabismaleimidebenzene, 1,4-bis(p-maleimidecumyl) benzene, 1,4-bis(m-maleimidecumyl)benzene and the like. These may be used alone or in combinations of two or more. Preferred imide compounds are imide compounds represented by the following general formulas (IV)-(VI).

[Chemical Formula 8]

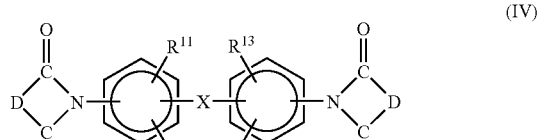

(IV)

[Chemical Formula 9]

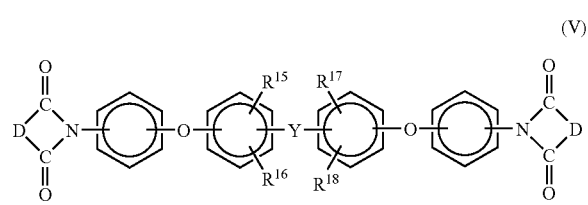

(V)

[Chemical Formula 10]

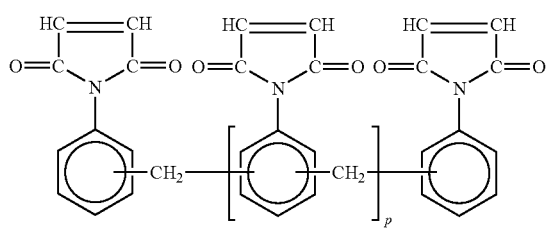

(VI)

In formulas (IV)-(VI), X and Y each independently represent —O—, —CH$_2$—, —CF$_2$—, —SO$_2$—, —S—, —CO—, —C(CH$_3$)$_2$— or —C(CF$_3$)$_2$—, $R^{11}$, $R^{12}$, $R^{13}$, $R^{14}$, $R^{15}$, $R^{16}$, $R^{17}$ and $R^{18}$ each independently represent hydrogen atom, a lower alkyl or lower alkoxy group or a fluorine atom, chlorine or bromine atom, D represents a dicarboxylic acid residue with an ethylenic unsaturated double bond, and p represents an integer of 0-4.

As examples of fillers for component (D) there may be mentioned conductive (metal) fillers such as silver powder, gold dust and copper powder, and inorganic fillers such as silica, alumina, titania, glass, iron oxide, ceramic and the like. Including the (D) filler can impart to the resin paste the thixotropic properties required for printing.

Of the fillers mentioned above, conductive (metal) fillers such as silver powder, gold dust and copper powder are added to impart conductivity, heat conductive properties or thixotropic properties to the adhesives. Inorganic fillers such as silica, alumina, titania, glass, iron oxide and ceramics are added to impart low thermal expansion properties, low moisture absorption coefficient and thixotropic properties to adhesives. These may be used alone or in combinations of two or more.

Inorganic ion exchangers may be added as fillers to enhance the electrical reliability of the semiconductor device. Effective inorganic ion exchangers include those known to have ion sequestering effects on ions such as Na$^+$, K$^+$, Cl$^-$, F$^-$, RCOO$^-$ or Br$^-$ that are extracted into aqueous solution when the cured paste is extracted in hot water. As examples of such ion exchangers there may be mentioned natural minerals such as naturally produced zeolite, other zeolites, acidic white clay, dolomite, hydrotalcites and the like, as well as artificially synthesized synthetic zeolites.

These conductive fillers and inorganic fillers may be used alone or in combinations of two or more. Also, one or more conductive fillers may be combined with one or more inorganic fillers so long as the physical properties are not impaired.

For most purposes, the content of the (D) filler is preferably 1-100 parts by mass and more preferably 2-50 parts by mass with respect to 100 parts by mass of component (B). The filler content is preferably at least 1 part by mass from the viewpoint of imparting satisfactory thixotropic properties (for example, a thixotropy index of 1.5 or greater) to the resin paste. The filler content is also preferably no greater than 100 parts by mass from the viewpoint of adhesion, because a content exceeding 100 parts by mass will increase the elastic modulus of the cured product, resulting in lower stress relaxation of the die bonding material and potential reduction in mounting reliability of the semiconductor device.

Mixing and kneading of the (D) filler were accomplished using an appropriate combinations of dispersers such as an ordinary stirrer, kneader, triple roll, ball mill or the like.

The printing solvent as component (E) is preferably selected from among solvents that allow uniform kneading and dispersion of the (D) filler. From the viewpoint of preventing volatilization of the solvent during printing, the solvent is preferably one with a boiling point of 100° C. or higher. The viscosity of the resin paste can be adjusted using the (E) printing solvent.

As examples of printing solvents there may be mentioned N-methyl-2-pyrrolidinone, diethyleneglycol dimethyl ether (also known as diglyme), triethyleneglycol dimethyl ether (also known as triglyme), diethyleneglycol diethyl ether, 2-(2-methoxyethoxy)ethanol, γ-butyrolactone, isophorone, carbitol, carbitol acetate, 1,3-dimethyl-2-imidazolidinone, 2-(2-butoxyethoxy)ethyl acetate, ethylcellosolve, ethylcellosolve acetate, butylcellosolve, dioxane, cyclohexanone and anisole, as well as solvents composed mainly of petroleum distillation products used as solvents for printing inks. Any of these may be used alone or in mixtures of two or more.

The content of the (E) printing solvent is preferably such that the resin paste solid content is 40-90 mass %. A solid content of at least 40 mass % is preferred from the viewpoint of preventing morphological changes caused by volume reduction after paste drying, while a solid content of no greater than 90 mass % is preferred from the viewpoint of improving the flow property and printing workability of the paste.

When notable bubbles and voids are generated during printing of the resin paste, it is effective to add various additives such as defoaming agents, foam breakers and foam inhibitors to the (E) printing solvent. From the viewpoint of exhibiting a foam-inhibiting effect, these are preferably added in an amount of at least 0.01 mass % based on the total mass of the (E) printing solvent and additives, and from the viewpoint of adhesion and paste viscosity stability they are preferably added in an amount of no greater than 10 mass %.

For enhanced adhesive force, silane coupling agents, titanium-based coupling agents, nonionic surfactants, fluorine-based surfactants, silicone-based additives and the like may be added to the resin paste as appropriate.

The thixotropy index of the resin paste is preferably 1.0-8.0. If the thixotropy index of the resin paste is at least 1.0, it will be easier to prevent running of the paste supplied and coated in the printing process, and thus maintain a more satisfactory printed form. If the thixotropy index of the resin paste is limited to no greater than 8.0, it will be easier to prevent "chipping" and "thinning" of the paste supplied and coated in the printing process.

The viscosity (25° C.) of the resin paste is preferably 5-1000 Pa·s. A resin paste viscosity of 5-1000 Pa·s is preferred from the viewpoint of printing manageability. The viscosity of the resin paste is preferably adjusted as appropriate according to the type of printing process, and for example, it is preferably adjusted within a range of 5-100 Pa·s when a mesh or the like is spread across a mask opening, such as in the case of a screen mesh board, for proper passage through the mesh section, or within a range of 20-500 Pa·s in the case of a stencil board. When numerous voids are found remaining in the dried paste, it is effective to adjust the viscosity to no greater than 150 Pa·s.

The viscosity is the value measured using an E-type rotating viscometer under conditions of 25° C., 0.5 rpm. The thixotropy index is defined as the ratio between the value measured with an E-type rotating viscometer under conditions of 25° C., 1 rpm and the value measured under conditions of 25° C., 10 rpm (thixotropy index=(viscosity at 1 rpm)/(viscosity at 10 rpm)).

The obtained die bonding resin paste may be supplied and coated onto lead frames such as 42-alloy lead frames or copper lead frames, plastic films made of polyimide resins, epoxy resins or polyimide-based resins, based materials such as nonwoven glass fabrics that have been impregnated or coated with cured plastics such as polyimide resins, epoxy resins or polyimide-based resins, and ceramic supporting members such as alumina or the like, by a printing process for B-staging. A support substrate with a B-stage adhesive can thus be obtained. A semiconductor element (chip) such as an IC or LSI is attached to the support substrate with the B-stage adhesive, and heated to bond the chip to the support substrate. A subsequent step of postcuring of the resin paste can mount the chip onto the support substrate. The postcuring of the resin paste may be combined with postcuring step of the sealing material, so long as this does not pose a problem in the mounting and assembly steps.

The process for production of a semiconductor device according to the invention comprises at least a coating step in which the resin paste is coated onto a board to form a coated film and a semiconductor chip mounting step in which a semiconductor chip is mounted on the coated film, and preferably it further comprises a drying step in which the coated film is dried after the coating step for B-staging, more specifically comprising each of the steps described above. A semiconductor device according to the invention is produced by a production process comprising the aforementioned steps.

The die bonding resin paste contains a solvent, but when it is used in a semiconductor device production process, B-staging by the drying step causes volatilization of the majority of the solvent, thereby allowing assembly of a semiconductor device with minimal voids in the die bonding layer and satisfactory mounting reliability.

Alternatively, the semiconductor element may be attached without dry semi-curing after the resin paste has been supplied and coated by printing, so long as this does not affect the package reliability, and subsequently heated to bond the chip to the support substrate.

Thus, the process for production of a semiconductor device according to another aspect of the invention comprises steps in which a prescribed amount of the die bonding resin paste is coated onto a board and a semiconductor chip is mounted on the resin paste, and a semiconductor device according to another aspect of the invention is produced by a production process comprising the aforementioned steps.

FIG. 1 is a schematic cross-sectional view showing an embodiment of a semiconductor device (board with a memory BOC configuration) according to the invention. In the semiconductor device 100 shown in FIG. 1, a semiconductor chip 2 such as an IC chip is bonded to a board 6 with solder balls 8 via an adhesive 4 composed of a die bonding resin paste according to the invention. The solder balls 8 are formed on the circuit layer 14 formed on the surface of the board 6. A resist layer 16 is also formed on the circuit layer 14. The semiconductor device 100 has a construction wherein the terminals of the semiconductor chip 2 are electrically connected to the board 6 via wires 10 such as gold wires, and then sealed with a sealing resin 12.

EXAMPLES

The invention will now be explained in greater detail based on examples and comparative examples.

Examples 1-5 and Comparative Examples 1-4

After reacting diphenylmethane-4,4'-diisocyanate (1.0 mol), diphenylmethane-2,4'-diisocyanate (1.0 mol) and polytetramethylene glycol with a weight-average molecular weight of 1,000 (0.8 mol) in 1-methyl-2-pyrrolidone (hereinafter, "NMP") at 100° C. for 1 hour under a nitrogen atmosphere, 4,4'-oxydiphthalic anhydride (1.0 mol) and NMP (60.0 mol) were added thereto and the mixture was stirred at 100° C. for 3 hours. Benzyl alcohol (0.49 mol) was then added, the mixture was stirred at 100° C. for 1 hour, and the reaction was terminated. The obtained solution was placed in vigorously stirred water, and the resulting precipitate was separated out and dried in a vacuum at 80° C. for 8 hours to obtain a polyurethaneimide resin. The obtained polyurethaneimide resin was measured by GPC to be Mw=93,700, Mn=38,800, based on polystyrene. The obtained polyurethaneimide resin was dissolved in carbitol acetate (CA) to a solid concentration of 40 mass % to obtain a polyurethaneimide resin solution.

A polyimide resin 1 was produced by the following procedure. First, 10.9 g (0.05 mol) of 4,9-dioxadecane-1,12-diamine, 20.5 g (0.05 mol) of 2,2-bis(4-aminophenoxyphenyl) propane and 150 g of NMP were placed in a 500 ml 4-necked flask equipped with a thermometer, stirrer and silica gel tube, and the mixture was stirred. Next, 52.0 g (0.1 mol) of 1,10-(decamethylene)bis(trimellitate dianhydride) was gradually added while cooling the flask in an ice bath. Upon completion of the addition, reaction was conducted for 3 hours in an ice bath and then for 4 hours at room temperature, and then 100 g of xylene was added, the mixture was heated at 180° C. for 3 hours while blowing in nitrogen gas, and the xylene was azeotropically removed with the water. NMP was further added to obtain a NMP solution of the polyimide resin 1 with a solid concentration of 40 mass %.

A polyimide resin 2 was produced by the following procedure. First, 60.0 g (0.03 mol) of polyoxypropylenediamine (trade name: D2000, BASF), 14.0 g (0.07 mol) of 1,12-diaminododecane and 150 g of NMP were placed in a 500 ml 4-necked flask equipped with a thermometer, stirrer and silica gel tube, and the mixture was stirred. Next, 49.4 g (0.1 mol) of 2,2-bis[4-(3,4-dicarboxyphenoxy)phenyl]propane dianhydride was gradually added while cooling the flask in an ice bath. Upon completion of the addition, reaction was conducted for 3 hours in an ice bath and for 4 hours at room temperature, and then 100 g of xylene was added, the mixture was heated at 180° C. for 3 hours while blowing in nitrogen gas, and the xylene was azeotropically removed with the water. NMP was further added to obtain a NMP solution of the polyimide resin 2 with a solid concentration of 40 mass %.

There was also prepared a carbitol acetate (36 parts by mass) solution containing 14.1 part by mass of a cresol-novolac-type epoxy resin (trade name: YDCN-702S, product of Tohto Kasei Co., Ltd., epoxy equivalents: 200) and 9.9 parts by mass of a bisphenol A-novolac resin (trade name: VH-4170, product of Dainippon Ink and Chemicals, Inc., OH equivalents: 118). There were additionally prepared carboxylic acid-terminated liquid polybutadiene (trade name: CTBNX-1300×9, product of Ube Industries, Ltd., number of functional groups: 2.3/mol), tetraphenylphosphonium tetraphenylborate (trade name: TPPK, product of Tokyo Kasei Kogyo Co., Ltd.) and AEROSIL (trade names AEROSIL 50 and AEROSIL 380, products of Nippon Aerosil Co., Ltd., silica fine powder).

The materials were placed in a kneader in the proportions listed in Table 1 as solid mass ratio, and after kneading, they were subjected to 1 hour of defoaming and kneading at 5 Ton or less to obtain die bonding resin pastes for Examples 1-5 and Comparative Examples 1-4. The contents of carbitol acetate (CA) in Table 1 are the amounts of carbitol acetate included as solvent in the polyurethaneimide resin solution and in the epoxy resin and phenol resin carbitol acetate solutions.

The hot die shear strength at 180° C. after contact bonding of the semiconductor chip was measured as a property of the resin paste. The hot die shear strength was measured by the following method. Specifically, each of the resin pastes of Examples 1-5 or Comparative Examples 2-4 was printed onto a 42-alloy lead frame and dried in an oven at 150° C. for 70 minutes to form a B-staged coated film (die bonding layer). The resin paste of Comparative Example 1 was printed onto a 42-alloy lead frame and then dried in an oven at 140° C. for 90 minutes to form a B-staged coated film (die bonding layer). Next, a 5×5 mm silicon chip (0.5 mm thickness) was contact bonded onto the die bonding layer for 1 second by application of a 1.5 kg load while on a heating plate at 180° C. An automatic adhesive force tester (trade name: Series-4000, product of Dage, Ltd.) was used to measure the shear strength (kgf/chip) at 180° C. The results are shown in Table 1.

TABLE 1

|  |  |  | Examples |  |  |  |  | Comparative Examples |  |  |  |
|---|---|---|---|---|---|---|---|---|---|---|---|
|  |  |  | 1 | 2 | 3 | 4 | 5 | 1 | 2 | 3 | 4 |
| Composition (parts by mass) | Epoxy resin | YDCN-702S | 14.1 | 14.1 | 14.1 | 14.1 | 14.1 | 14.1 | 14.1 | 14.1 | — |
|  | Phenol resin | VH-4170 | 9.9 | 9.9 | 9.9 | 9.9 | 9.9 | 9.9 | 9.9 | 9.9 | — |
|  | Polyurethaneimide resin |  | 16 | 16 | 16 | 16 | 16 | — | — | — | 16 |
|  | Polyimide resin 1 |  | — | — | — | — | — | — | — | 16 | — |
|  | Polyimide resin 2 |  | — | — | — | — | — | — | 16 | — | — |
|  | Rubber component | CTBNX-1300 × 9 | 8 | 12 | 16 | 20 | 24 | 40 | 8 | 8 | 8 |
|  | Filler | AEROSIL 380 | 1 | 1 | 1 | 1 | 1 | 1 | 1 | 1 | 1 |
|  |  | AEROSIL 50 | 9 | 9 | 9 | 9 | 9 | 9 | 9 | 9 | 9 |
|  | Curing accelerator | TPPK | 0.1 | 0.1 | 0.1 | 0.1 | 0.1 | 0.1 | 0.1 | 0.1 | 0.1 |
|  | Solvent | CA | 60 | 60 | 60 | 60 | 60 | 36 | 36 | 36 | 24 |
|  |  | NMP | — | — | — | — | — | — | 24 | 24 | — |
| Property | Hot die shear strength (kgf/chip) |  | 1.0 | 1.0 | 0.9 | 0.8 | 0.7 | 0.4 | 0.2 | — | 0.0 |

As seen in Table 1, the hot die shear strength could not be measured for Comparative Example 3 because the resins did not compatibilize and a paste could not form. In Comparative Example 4, the resin paste fused by the heating during measurement of the hot die shear strength, resulting in a measured value that was less than 0.1 kgf/chip.

As shown in Table 1, the resin pastes of the invention (Examples 1-5) had high heat resistance without postcuring after printing, B-staging and chip contact bonding, and exhibited more satisfactory hot die shear strength at 180° C. than the conventional resin pastes (Comparative Examples 1-4).

INDUSTRIAL APPLICABILITY

As explained above, the present invention can provide a die bonding resin paste that can be easily supplied and coated by printing onto boards that require attachment of semiconductor chips at relatively low temperature. Moreover, the die bonding resin paste of the invention is heat resistant and manageable, while exhibiting low stress properties and low-temperature adhesion. Furthermore, since its heat resistance is excellent in the B-stage state, it is possible to omit the postcuring step following contact bonding of the semiconductor chip, thus aiding in process control and shortening of the assembly time for assembly of semiconductor devices. The die bonding resin paste of the invention may be suitably used for die bonding of insulating support bases such as organic boards, or copper lead frames, as well as for 42-alloy lead frames. According to the invention it is also possible to provide a process for production of a semiconductor device employing the die bonding resin paste of the invention, and a semiconductor device produced by the production process.

The invention claimed is:
1. A die bonding resin paste comprising a polyurethaneimide resin represented by the following general formula (I), a thermosetting resin, a filler and a printing solvent,

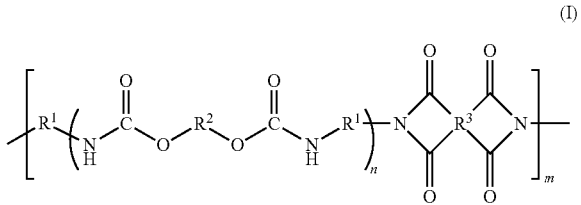 (I)

wherein said thermosetting resin is a resin mixture of an epoxy resin, a phenol resin or a compound with a phenolic hydroxyl group in the molecule, and a curing accelerator, and wherein a content of the phenol resin or the compound with a phenolic hydroxyl group in the molecule is 10-120 parts by mass with respect to 100 parts by mass of the epoxy resin.

2. A process for production of a semiconductor device that comprises
   a coating step in which a die bonding resin paste according to claim 1 is coated onto a board to form a coated film, and
   a semiconductor chip mounting step in which a semiconductor chip is mounted onto the coated film.

3. A process for production of a semiconductor device according to claim 2,
   which further comprises a drying step after the coating step, in which the coated film is dried for B-staging,
   wherein the semiconductor chip is mounted on the B-staged coated film in the semiconductor chip mounting step.

4. A semiconductor device obtained by a process for production of a semiconductor device according to claim 2.

5. A semiconductor device obtained by a process for production of a semiconductor device according to claim 3.

6. The die bonding resin paste according to claim 1, which further comprises a butadiene polymer with a carboxylic acid end group.

7. The die bonding resin paste according to claim 1, wherein the epoxy resin contains at least two epoxy groups in the molecule.

8. The die bonding resin paste according to claim 1, wherein the phenol resin has at least two phenolic hydroxyl groups in the molecule.

9. The die bonding resin paste according to claim 1, wherein said printing solvent has a boiling point of at least 100° C.

* * * * *

UNITED STATES PATENT AND TRADEMARK OFFICE
CERTIFICATE OF CORRECTION

PATENT NO. : 8,212,370 B2
APPLICATION NO. : 12/444230
DATED : July 3, 2012
INVENTOR(S) : S. Mori et al.

It is certified that error appears in the above-identified patent and that said Letters Patent is hereby corrected as shown below:

Correct claim 1 as shown below:
Column 15, after the general formula (I), in line 5, insert -- wherein R1 represents a divalent organic group containing an aromatic ring or aliphatic ring, R2 represents a divalent organic group with a molecular weight of 100-10,000, R3 represents a tetravalent organic group containing 4 or more carbon atoms, and n and m each independently represent an integer of 1-100, --.

Signed and Sealed this
Sixth Day of November, 2012

David J. Kappos
*Director of the United States Patent and Trademark Office*